(12) United States Patent
Klimek (10) Patent No.: US 7,116,690 B2
(45) Date of Patent: Oct. 3, 2006

(54) STAGGERED ARRAY COUPLER

(75) Inventor: Daniel E. Klimek, Lexington, MA (US)

(73) Assignee: Textron Systems Corporation, Wilmington, MA (US)

( * ) Notice: Subject to any disclaimer, the term of this patent is extended or adjusted under 35 U.S.C. 154(b) by 197 days.

(21) Appl. No.: 10/847,162

(22) Filed: May 17, 2004

(65) Prior Publication Data

US 2005/0254539 A1 Nov. 17, 2005

(51) Int. Cl.
*H01S 3/04* (2006.01)
*H01S 5/00* (2006.01)
*H01S 3/08* (2006.01)

(52) U.S. Cl. ............... 372/35; 372/50.12; 372/108
(58) Field of Classification Search ............ 372/35, 372/36, 50.12, 108
See application file for complete search history.

(56) References Cited

U.S. PATENT DOCUMENTS

| | | | |
|---|---|---|---|
| 5,099,311 A | | 3/1992 | Bonde et al. |
| 5,218,515 A | | 6/1993 | Bernhardt |
| 5,453,641 A | | 9/1995 | Mundinger et al. |
| 5,548,605 A | | 8/1996 | Benett et al. |
| 5,828,683 A | * | 10/1998 | Freitas ............... 372/36 |
| 5,987,043 A | * | 11/1999 | Brown et al. ......... 372/36 |
| 6,151,342 A | * | 11/2000 | Nightingale et al. .... 372/36 |
| 6,229,831 B1 | * | 5/2001 | Nightingale et al. .... 372/36 |
| 6,240,116 B1 | * | 5/2001 | Lang et al. .......... 372/50.12 |
| 6,521,516 B1 | | 2/2003 | Monzon et al. |
| 6,571,569 B1 | | 6/2003 | Rini et al. |
| 2003/0198264 A1 | | 10/2003 | Vetrovec et al. |
| 2004/0067016 A1 | | 4/2004 | Anikitchev et al. |
| 2005/0069260 A1 | * | 3/2005 | Klimek et al. ........ 385/50 |

OTHER PUBLICATIONS

Apollonov, V.V. et al., "Intensification of heat transfer in high-power laser diode bars by means of a porous metal heat-sink," Optics Express, vol. 4 (No. 1), pp. 27-32, (Jan. 4, 1999), Optical Society of America.

* cited by examiner

*Primary Examiner*—James Menefee
(74) *Attorney, Agent, or Firm*—BainwoodHuang (57) ABSTRACT

Embodiments of the present invention are directed to staggered arrays of laser diode bars positioned on stepped support structures. Optical waveguides may direct the outputs of the individual diode bars to a desired location, for example, a common output plane. The optical waveguides may be glass plates in certain embodiments. Waste heat generated by the diode bars may be removed from the support structures at certain locations and as a result, the diode bars may be closely positioned with respect to each other. By closely positioning the laser diode bars and directing the diode bar outputs to a desired orientation, the effective brightness and fluence may be increased for a given output area and operational power compared to the prior art. Associated methods of manufacturing staggered array couplers and producing high-power pump energy are also described.

46 Claims, 12 Drawing Sheets

FIG. 12 ic bars 301 and cooling slabs 330.
STAGGERED ARRAY COUPLER

BACKGROUND

Semiconductor laser diode assemblies or diode "bars" are commonly used for many applications, including to optically excite or "pump" the gain media of other lasers. Such diode bars typically have a series of light emitting laser diodes aligned along a common substrate at regular intervals, forming a row or "stripe" of diode emitters.

Figure 1:
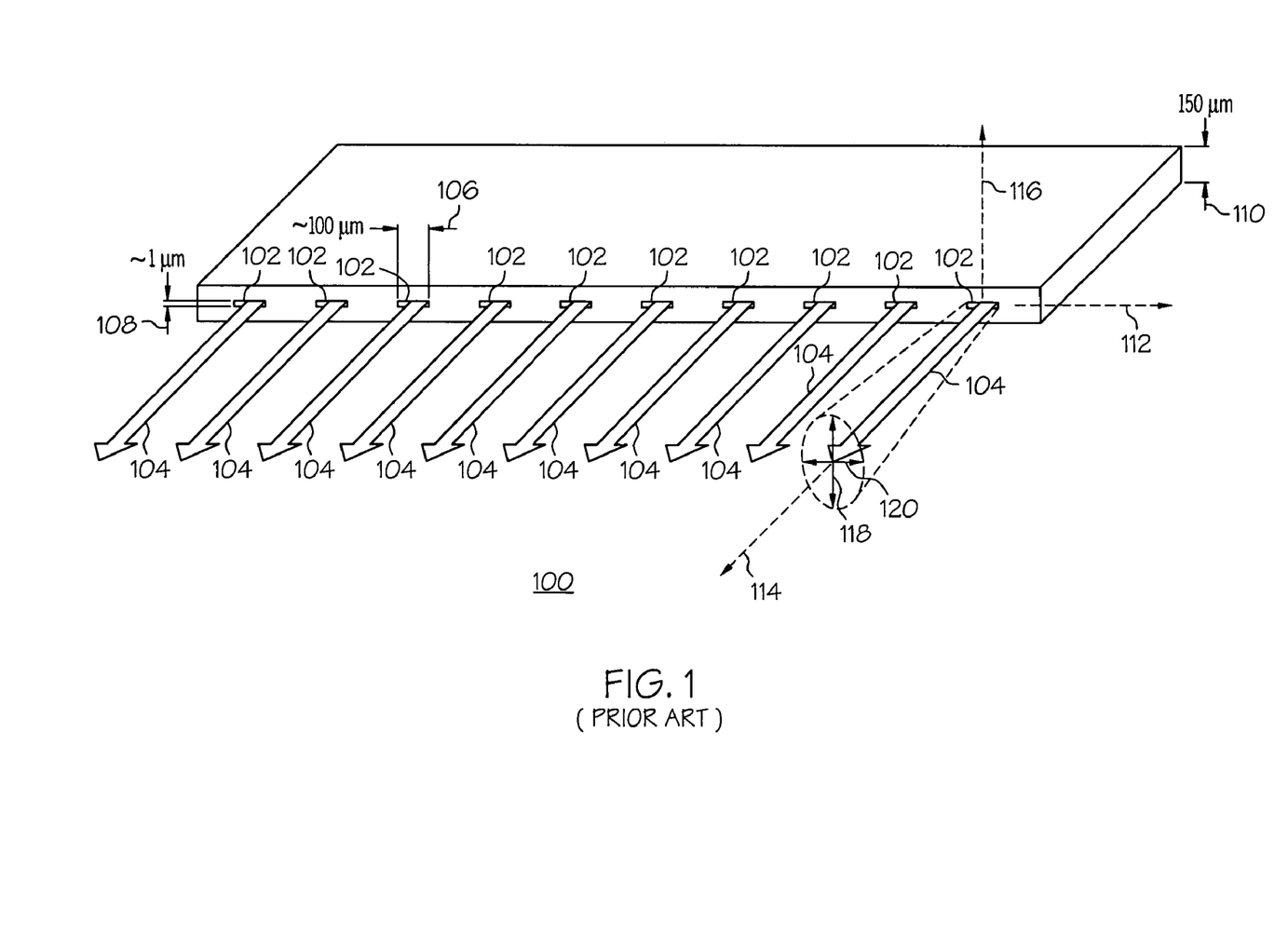
FIG. 1 is a perspective view of a prior art diode bar.

FIG. 1 is a perspective view of a prior art laser diode bar 100. In this example, the diode bar includes ten diode emitters 102. Each diode bar typically has a width 110 that is approximately 150 microns along an axis 116 that is perpendicular to an axis 112 of the diode bar stripe. The diode bar 100 emits a combined output from the combined emitting areas of the individual diode emitters 102. Each diode emitter 102 typically has an area with a width 108 and length 106 that are, for example, one micron and 100 microns, respectively.

Output beams 104 produced by the individual diode emitters 102 along an output axis 114 have a relatively broad angular divergence in one direction or axis 118 and a smaller degree of divergence in the orthogonal direction or axis 120. This pronounced difference in angular divergence characterizes the output of edge-emitting laser diodes. These axes are often referred to as the "fast" and "slow" axes, 118 and 120, respectively. For example, the angular divergence $\theta_1$ of an output beam 104 may be approximately 30° along the fast axis 118 and the angular divergence $\theta_2$ of the output beam may be approximately 10° along the slow axis 120. This difference in angular divergence produces an output 104 having an elliptical distribution as shown in FIG. 1. For the angular divergence angles given, a ratio of the angular divergences, or aspect ratio, of 3:1 is produced. Typical aspect ratios for diode lasers may range from, for example, 2:1 to 10:1.

While laser diodes have a relatively high electrical efficiency compared to other types of lasers, an individual laser diode typically operates at a relatively low-power. Laser diode bars have output powers that are scaled according to how many individual laser emitters are included within the particular diode bar. One limitation on the output power of laser diodes and diode bars is the generation of excess heat during operation of the diodes. Cooling means have been used to remove heat in attempts to increase power from a given diode bar.

Figure 2:
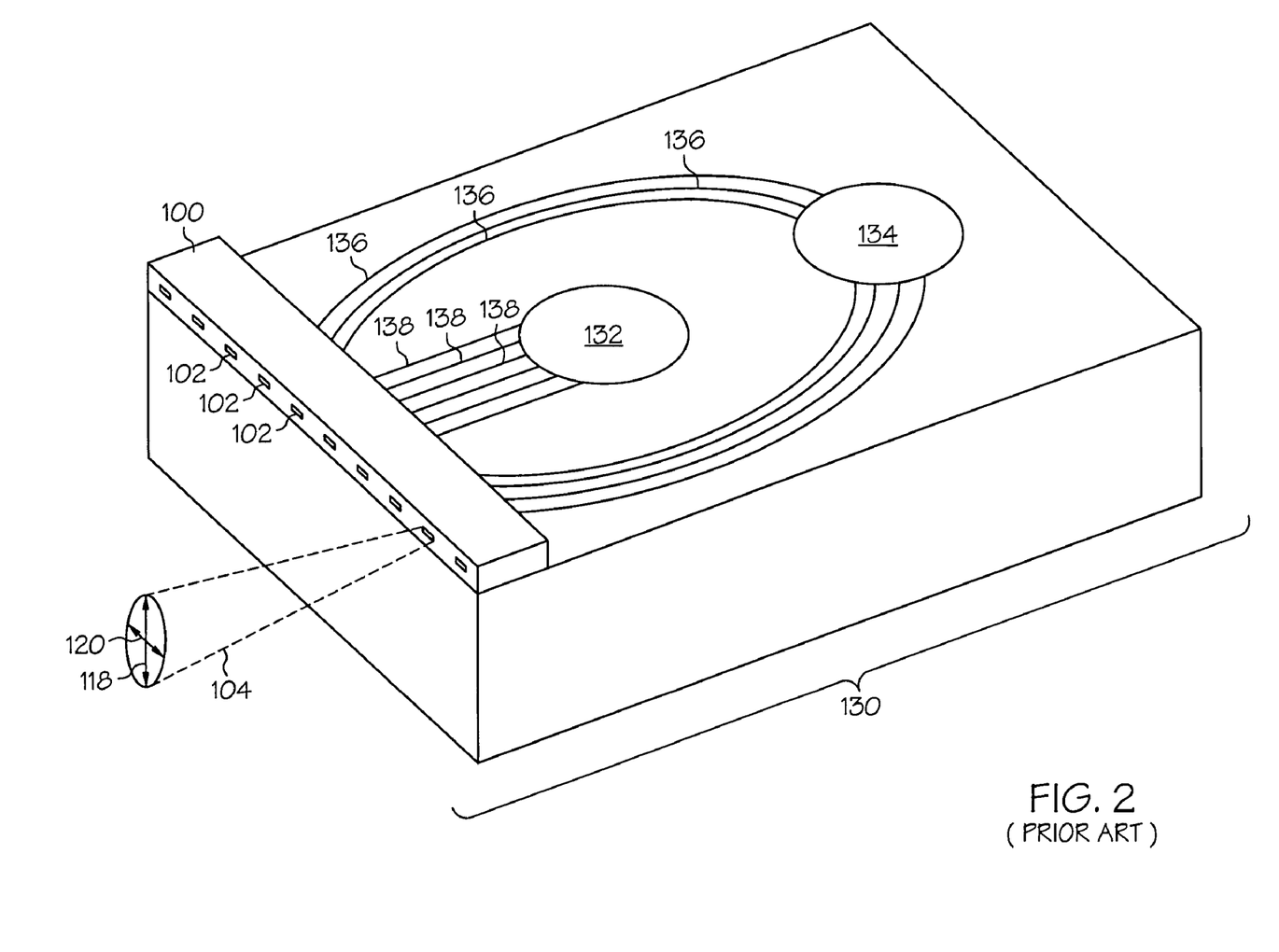
FIG. 2 is a perspective view of a prior art diode bar mounted on a cooling slab.

FIG. 2 is a perspective view of the prior art laser bar of FIG. 1 mounted on a cooling slab 130 forming a modular unit. The laser diode emitters 102 are configured to emit the output beams as shown in a parallel orientation to the major dimension of the cooling slab 130. The cooling slab 130 is typically made of a material with a high heat conductance value, such as copper. Fluid passages 132, 134 are typically used to supply a coolant liquid such as water. Small fluid passages 136, 138 or microchannels may be included in the slab to facilitate heat removal from the diode bar.

Because laser diode bars have been limited in power output, even with cooling slabs as shown in FIG. 2, additional attempts have been made to increase the intensity and fluences of outputs from such diode bars. For example, laser bars have been placed adjacent to one another or stacked in stacked laser diode bar assemblies. One example of a stacked laser diode bar assembly is shown in FIG. 3.

Figure 3:
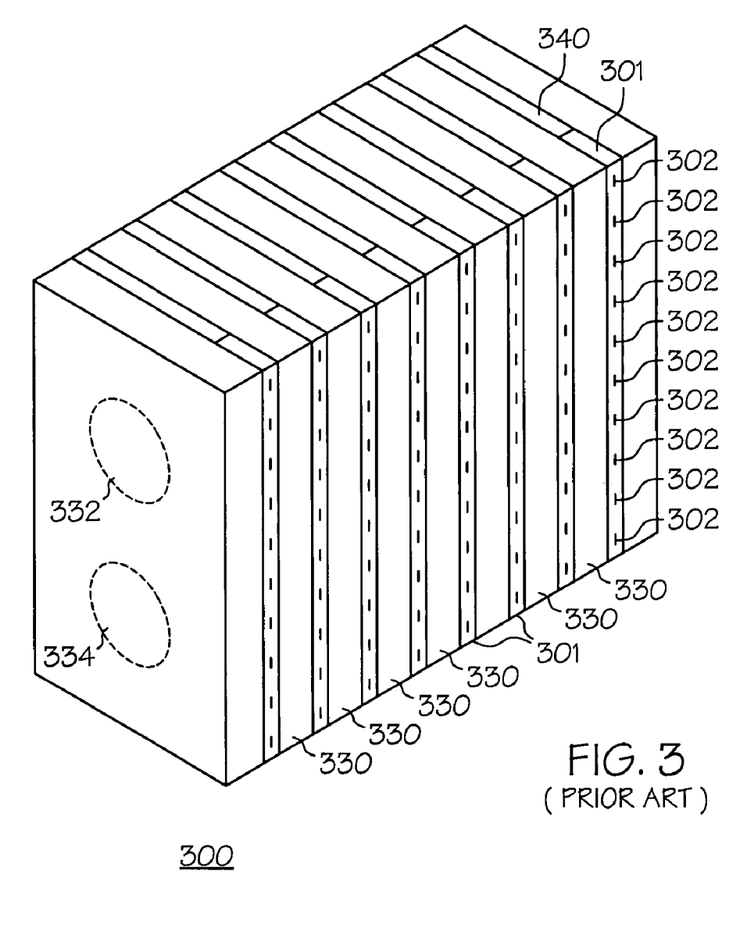
FIG. 3 is a perspective view of a prior art stack of diode bars and cooling slabs of FIG. 2.

FIG. 3 is a perspective view of a stack 300 of diode bar and cooling slab units shown in FIG. 2. Multiple diode bars 301 with emitters 302 are mounted in between cooling slabs 330 in a modular arrangement. Cooling passages or channels 332 and 334 may be included for liquid heat transfer. Spacers 340 may be present to facilitate alignment of the diode bars 301 and cooling slabs 330.

For certain applications, such as when used for optical excitation means or as a pump source, it may be desirable for a light source to produce light that has a high brightness. The brightness of a given light source, for example a laser diode or diode bar 301, is described by the brightness equation in Equation (1):

$$B=P/(A*\Omega) \tag{1}$$

In Equation 1, B is the brightness of the light source, P is the power output of the particular light source, $\Omega$ is the solid angle of the beam divergence, and A is the area of the light source. The brightness of a given light source consequently includes a power component, an area component and a divergence component. Typical units of measure are Watts for P, steradians (ster) for $\Omega$, $cm^2$ for A, and $Watts/cm^2/ster$ for B.

One limitation of the attainable brightness of stacked laser bar assemblies, such as 300, is the spacing or "pitch" between laser bars in the particular stack. According to Equation 1, the brightness of a laser diode bar and stacks of such diode bars is reduced by the percentage of non-light-emitting area of the structure outside the diode emitters. The ratio of the total emitter area compared to the total area of a stack is sometimes referred to as the fill factor of the diode stack.

With continued reference to FIG. 3, the non-light-emitting area of the diode bar stack 300 includes the space between emitters 302 in a particular diode bar and the space between adjacent diode bars. The space between adjacent diode bars, and therefore the fill factor, is primarily determined by the need to remove waste heat from the laser diodes. Without proper heat removal, the lifetime of the laser diode components are shortened, and wavelength fluctuations may occur over time. Currently, in systems that employ continuous wave (CW) diode bars, power densities about 200 $W/cm^2$ can be achieved, but this power density is currently limited to this amount, since the diode bars cannot be placed much closer together than 1–3 mm, for a 60 W diode bar, due to thermal management concerns.

Figure 4:
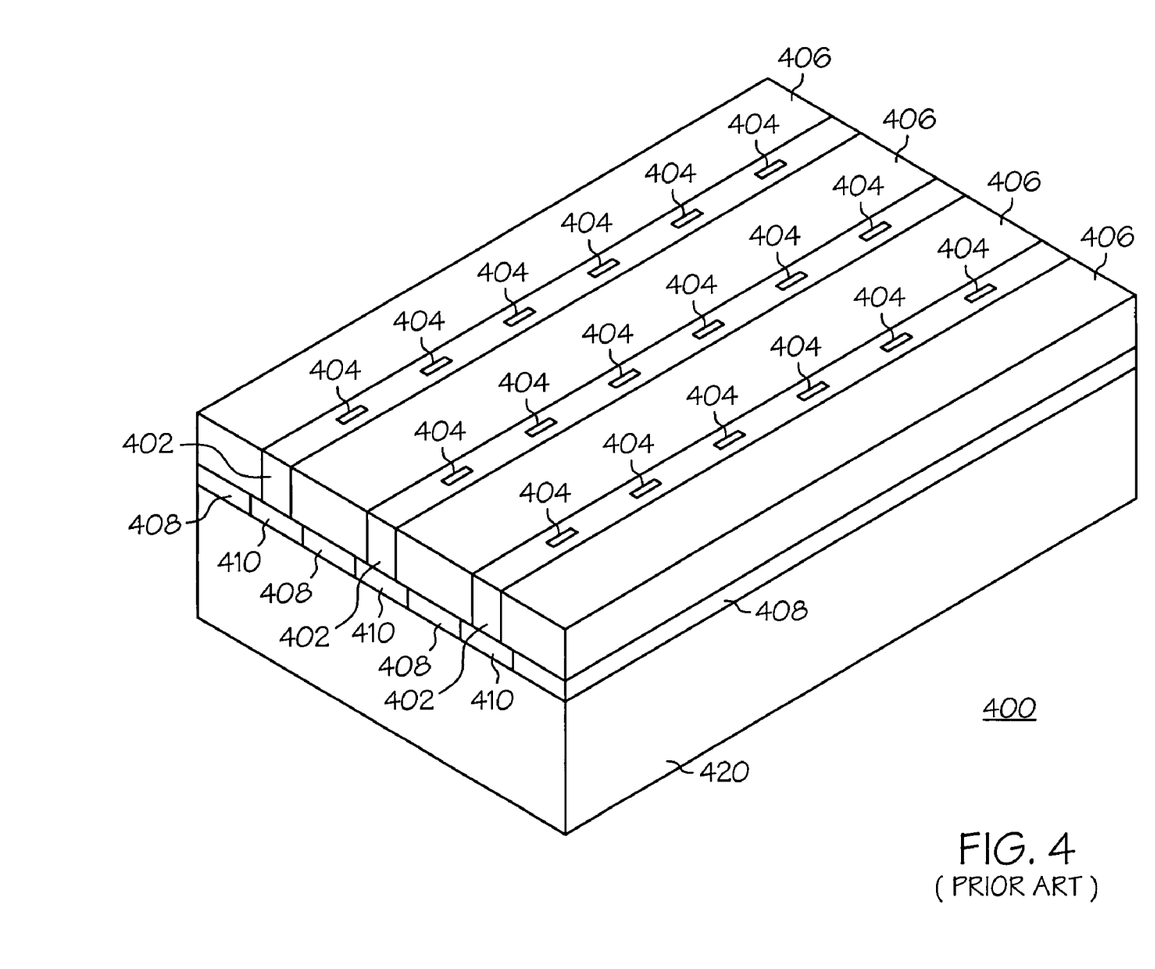
FIG. 4 is a perspective view of an alternate prior art stack of diode bars mounted on a cooling slab.

FIG. 4 is a perspective view of an alternate prior art diode bar stack 400 including a cooling slab 420. Each of the diode bars 402 includes a number of emitters 404. The diode bars 402 are separated by copper plates 406 that may act as heat spreaders and as electrical or ohmic contacts for the diode bars 402. The multiple diode bars 402 are mounted on the cooling slab 420 in an orientation where the diode outputs (not shown) are perpendicular to the cooling slab 420. A substrate is positioned between the diode bars and the cooling slab 420, and the substrate typically includes electrical conductors 408 and electrical insulators 410 to facilitate current flow through the active regions of the diode bars 402.

Prior art diode stacks such as those shown in FIG. 3 and FIG. 4 may have low fill factors when designed for high-power operation and consequently may produce a light output that has a relatively low brightness and/or fluence for the total area of the diode stack and for a given applied power.

SUMMARY

Embodiments of the present invention are directed to systems and methods that address the limitations described above for the prior art. In particular, the present invention provides systems and methods in which the beams of multiple diode bar assemblies are combined to achieve an increase in the resulting power density in the combined output beam, while addressing the need for heat removal from the diode bars.

A first embodiment of the present invention may include a staggered array coupler including a stepped support structure having two or more steps and a cooling surface, and two or more diode bars, each having an emitter face. Each of the two or more diode bars is disposed on a separate step of the two or more steps. The staggered array couple may include two or more optical waveguide plates, with each plate being disposed so that an input face is adjacent to an emitter face of one of the diode bars. The staggered array coupler may include cooling means in thermal communication with the cooling surface. The staggered array coupler may include two or more collimating lenses, with each lens disposed between an emitter face of one of the diode bars and an input face of one or the optical waveguide plates. The staggered array coupler may emit light within a desired wavelength range. The staggered array coupler may include pump means connected to the two or more diode bars. The staggered array coupler may include electrical connections between the diode bars, and the electrical connections may receive electrical current from a power source. The desired wavelength range may include a near infrared range.

A second embodiment of the present invention may include a stepped diode assembly adapted for use in a staggered array coupler. The stepped diode assembly may include a stepped support member having a plurality of steps, a step contact surface, and a cooling surface. The stepped diode assembly may also include a plurality of diode bars, with each said plurality of diode bars disposed on a respective one of said plurality of steps. The stepped diode assembly may include cooling means in thermal communication with the cooling surface. The cooling means may include a liquid spray system, a microchannel structure, or a cooling slab, for example.

A third embodiment may include an optical waveguide structure adapted for use in a staggered array coupler. The optical waveguide structure may include a plurality of optical waveguide plates, with each plate having an input face and an output face. Each of the input faces are offset with respect to each adjacent input face, and each of the optical waveguide plates may have a height corresponding to a diode pitch of a stepped support surface. The optical waveguide structure may have optical waveguide plates that are shaped as rectangular prisms. Each of the optical waveguide plates may have a constant cross section or each of the optical waveguide plates may have a varying cross section. Each of the optical waveguide plates may be made from Type BK7 optical glass. Each of the optical waveguide plates may include a collimating lens that is optically coupled to the input face and operable to receive a diode bar output. Each of the optical waveguide plates may include a polarizing filter that is optically coupled to the input face and operable to receive a diode bar output.

A fourth embodiment may include a method of manufacturing a staggered array coupler. A support structure may be formed with a support surface having two or more steps, each of the two or more steps being adapted to a diode bar height. A diode bar may be placed into thermal contact with each of the two or more steps. An optical waveguide plate may be placed adjacent to an emitting area of each of the diode bars. Output faces of the optical waveguide plates may be aligned in a desired orientation. The output faces of the optical waveguide plates may be aligned along a common plane. The output faces of the optical waveguide plates may be aligned along a desired curve. Cooling means may be integrated into the support structure. A collimating lens may be placed between each of the diode bars and an associated optical waveguide plate. The optical waveguide plates may be fused together. Waveguide spacers may be placed between the optical waveguide plates.

A fifth embodiment may include a method of producing high-power pump energy. Two or more diode bars may be positioned offset to each other on a support structure having two or more steps. The two or more diode bars may be energized to produce a diode bar output to form two or more diode bar outputs. Each of the diode bar outputs may be directed into an optical waveguide plate through an input face. Each of the diode bar outputs may be directed from an associated optical waveguide plate to a desired location. Heat may be removed from a support surface of each of the two or more steps. Each of the diode bar outputs may be directed to the desired location through a common output plane including output faces from each of the optical waveguide plates. The desired location may include a laser gain medium.

A sixth embodiment may include a laser pump system having two or more optical pump units having two or more staggered diode bars, two or more power supply connections, and a support structure, with each optical pump unit being operable to produce an output. The laser pump system may include redirection means receiving the outputs from the optical pump units and may be operable to combine the outputs. The redirection means may include one or more prisms or mirrors.

BRIEF DESCRIPTION OF THE DRAWINGS

These and other features, aspects, and advantages of the present invention will become better understood with regard to the following description, appended claims, and accompanying drawings. The drawings are not necessarily to scale, emphasis instead being placed on illustration of principles of the invention. The drawings include the following figures:

DETAILED DESCRIPTION

The present invention may be understood by the following detailed description, which should be read in conjunction with the attached drawings. The following detailed description of certain embodiments is by way of example only and is not meant to limit the scope of the present invention.

Embodiments of the present invention are directed to staggered arrays of laser diode bars positioned on stepped support structures. Optical waveguides may direct the outputs of the individual diode bars to a desired location, for example, a common output plane. Waste heat that is generated by the diode bars may be removed from the support structures at certain locations, and as a result, the influence of associated cooling means on the diode bar spacing may be minimized. By closely positioning the laser diode bars in a desired orientation, the effective brightness and fluence levels may be increased for a given diode stack area and operational power when compared to the prior art.

Figure 5:
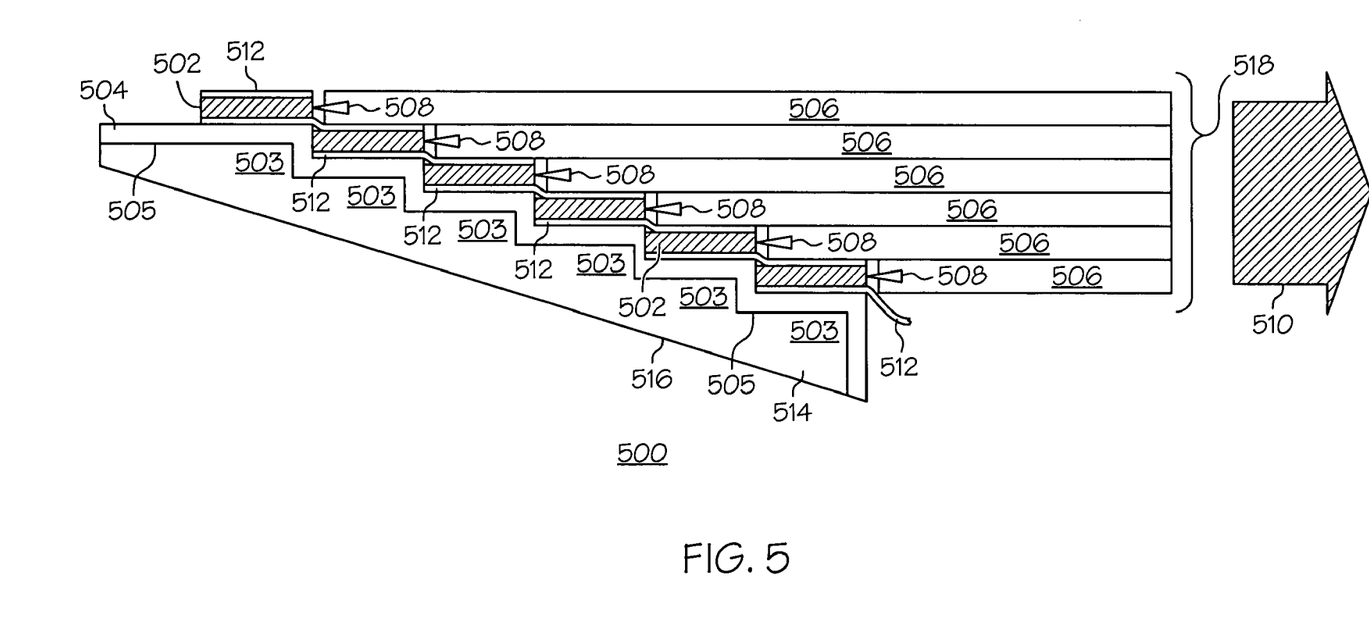
FIG. 5 is a side view of an embodiment of a staggered array coupler according to the present invention.

FIG. 5 shows a side view of an embodiment 500 of a staggered array coupler according to the present invention. The staggered array coupler 500 includes two or more laser diode bars 502, with each positioned on a support structure 514 in a staggered relation to adjacent diode bars. The staggered array coupler 500 has steps 503 to facilitate the staggered positioning of the diode bars 502. The support structure 514 includes a substrate or support surface 504 that supports the diode bars 502. The support surface 504 acts as a heat spreader or conductor. Optical waveguides, for example, optical waveguide plates 506, receive outputs 508 produced by the diode bars and direct the outputs 508 in a desired direction, for example, through a common output plane 518. The staggered array coupler 500 may have as many diode bars and optical waveguide plates 506 as desired.

The support structure 514 can include a cooling surface 505 and/or other cooling means (not shown) to remove heat from the diode bars 502. The cooling surface 505 is preferably at a minimum distance from the diode bars 502. The support surface 504 and cooling surface 505 include portions that are orthogonal or substantially orthogonal to the emitting areas of the diode bars 502. This configuration facilitates heat transfer through areas of the support surface 504 and cooling surface 505 that do not affect the spacing or separation distance or pitch between individual diode bars 502 in a direction parallel to the emitting areas. The support surface 504 and cooling surface 505, when present, accordingly enable the diode bars 502 to be placed much closer together along a particular dimension than previously possible. Desirable characteristic of support surface 504 and/or support structure 514 are thinness and a high heat conductance to improve heat transfer from the diode bars 502. In certain embodiments, materials for the substrate or support surface 504 may include, but are not limited to, high thermal conductivity materials such as diamond, copper, copper tungsten (e.g., 10% Cu, 90% W), and/or beryllium oxide (BeO).

The laser diode bars 502 may be made from any suitable semiconductor material and may be mounted and configured as desired. For example, the n-side or the p-side of a diode bar may be mounted proximate to the support surface as desired. In certain embodiments, it may be desirable to mount the p-side of a diode bar proximate to the support surface and cooling surface or cooling means, e.g., "p-side down", to facilitate heat transfer because the thickness of p-side of a diode bar is often less than the thickness of the associated n-side.

The cooling surface 505 may allow the transfer of heat to various cooling means or structure used in conjunction with the staggered array coupler 500. Any suitable cooling means (not shown) may be used to facilitate the removal of waste heat from the diode bars 502 through the support surface 504 and/or cooling surface 505. For example, suitable cooling means may include, but are not limited to, convective cooling, conductive cooling, and evaporative cooling methods and devices. Cooling means can include direct fluid cooling systems and techniques. In certain embodiments, the cooling surface 505 may be cooled by cooling means that include spray or evaporative cooling.

In certain embodiments, the support structure 514 can include one or more flanges or ribs 516 that support or reinforce the support surface 504. In certain embodiments, the support surface 504 and cooling surface 505 may be integrated with or connected to a structure that includes cooling means. Suitable cooling means may include microchannel devices made from silicon or copper. For example, the support surface may be mounted on or integrated with structure that allows for liquid movement through microchannels or porosities, for example, with diameters of 25μ–125μ.

Suitable connection techniques may be used to decrease the thermal resistance between the diode bars 502 and support surface 504, and also between the support surface and any underlying structure, e.g., cooling means. For example, solder, grease, or thermal paste may be used to fill in small surface irregularities or microscopic roughness on opposing surfaces of the staggered array coupler 500. In certain embodiments, thermal paste including polyethylene glycol and carbon black, e.g., in the form of 30-nm particles, may be used.

In certain embodiments, individual diode bars 502 may be mounted or fabricated on a substrate or support surface 504 that incorporates a silicon monolithic microchannel structure or wafer such as described in U.S. Pat. No. 5,548,605, entitled "Monolithic Microchannel Heatsink", the contents of which are incorporated herein by reference. In certain embodiments, the cooling means may include, an SA-2 impingement micro cooler, Type A, B, or C, which is available by Micro Cooling Concepts ($MC^2$) Inc., 7522 Slater Ave., #122, Huntington Beach, Calif. 92647.

With continued reference to FIG. 5, the optical waveguide plates 506 may have different lengths to accommodate the staggered positioning of the diode bars 502 on the support structure 514. Suitable materials for the optical waveguide plates may be selected based on physical and optical parameters, including but not limited to, hardness, manufacturability, and a low degree of absorption at the wavelength range of the diode bar output 508. In certain embodiments, glass such as optical glass, type BK7, may be used for diode bars emitting outputs 508 in a near infrared range, e.g., 700–2200 nm.

Figure 6:
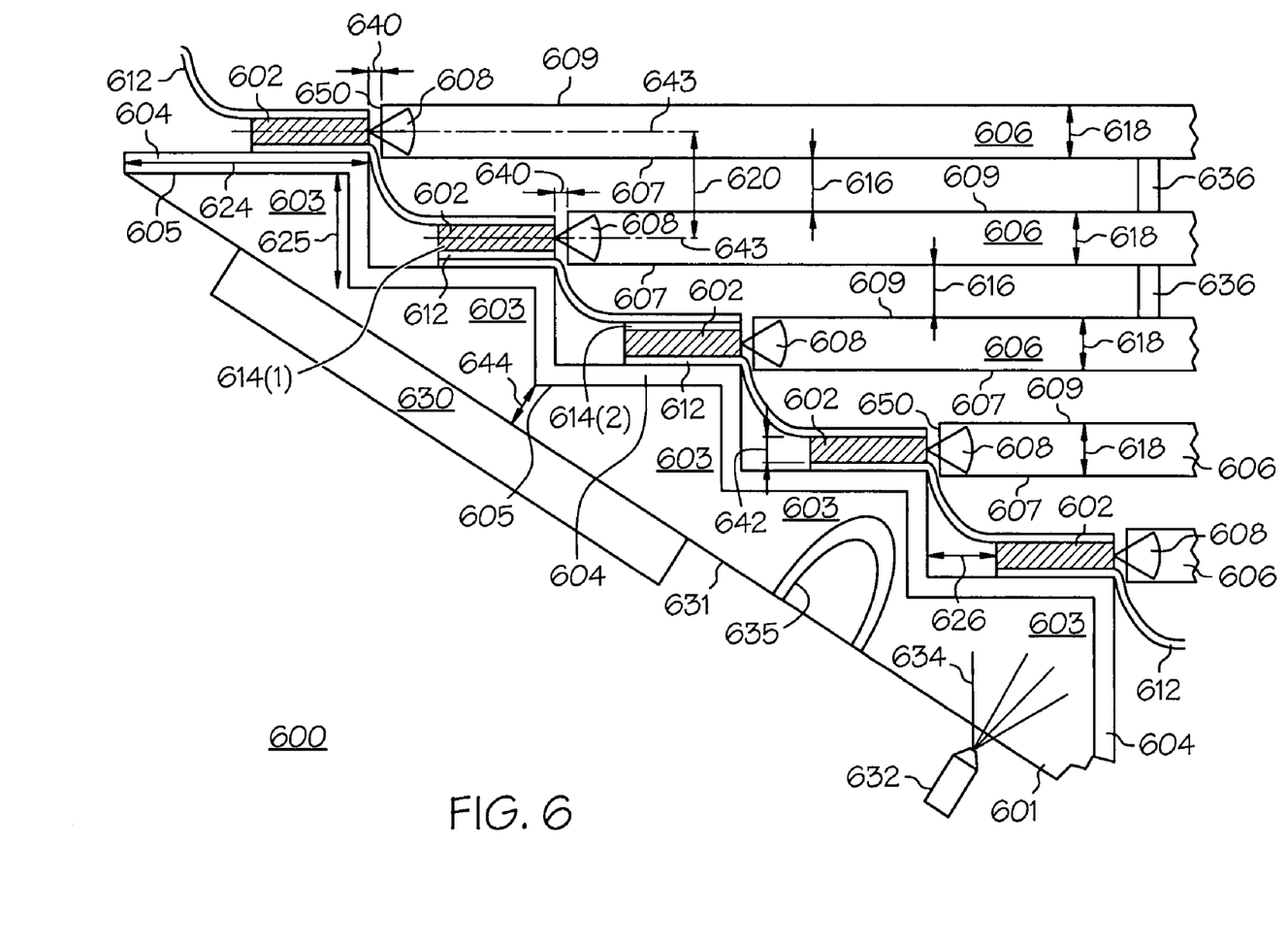
FIG. 6 is side view of an alternate embodiment of a staggered array coupler.

FIG. 6 shows a detailed side view of an alternate embodiment 600 of a staggered array coupler including two or more diode bars 602 positioned on a stepped support or stair structure 601. The stair structure 601 includes a number of steps 603, a support surface 604, and a cooling surface 605. The stair structure 601 supports the diode bars 602 and each step 603 in the stair structure 601 corresponds to a particular diode bar 602. Each step 603 has a step length 624, a step height 625, and a step width (in a direction perpendicular to the plane of FIG. 6).

Each diode bar 602 has appropriate pump means, for example, electrical connections 612 may be present to act as cathode and anode connections to supply current through the active regions of the diodes in the diode bars 602. Each diode bar 602 produces an optical output 608 that includes the outputs of the individual diode emitters in that bar 602. An optical waveguide plate 606 may be present for each diode bar 602. Each optical waveguide plate 606 receives an associated output 608 through an input face 650 and directs the output 608 to a desired location through an output face (not shown). The lengths of the individual optical waveguide plates 606 may be varied, and in certain embodiments, the output faces may be aligned along a common output plane.

Heat that is generated by the diode bars 602 may be removed by a thermal management system 630 or other cooling means though the cooling surface 605. Examples of suitable cooling means include, but are not limited to, microchannel structures 631 and/or liquid spray systems 632. It is desirable for the support surface 604 to be as thin as practical to reduce the distance to facilitate heat transfer between the diode bars 602 and associated cooling means, e.g., a thermal management system 630, microchannels 631, or a liquid-spray system 632.

By having a small thickness, e.g., between the support surface 604 and the cooling surface 605 or cooling means 630, a uniform, high-capacity heat transfer away from the diode bars 602 is facilitated, improving diode bar performance and longevity. Suitable means for cooling may include, but are not limited to, liquid-spray systems 632, which may include atomized liquid-spray cooling systems. One example of suitable liquid-spray cooling means are described in U.S. Pat. No. 6,571,569, entitled "Method and Apparatus for High Flux Heat Transfer", the contents of which are incorporated herein by reference.

The overall thickness 644 of the stair structure 601 may be designed and manufactured as required for given materials. In certain embodiments, the thickness 644 of the stair structure 601 may be essentially the thickness of the support surface 604. The support surface 604 can be made from any material with suitable material properties, e.g., stiffness, thermal conductivity, hardness, etc. In certain embodiments, the support surface 604 may have ribs or flanges 637 that support the cooling surface 605. In certain embodiments, each step 603 may be a modular unit, e.g., a strip with a triangular cross section, which is placed next to adjacent, similar steps 603 to form the stair structure 601.

The step height 625 of a particular step 603 may be matched or adapted to the diode bar height 642 of the associated diode bar 602. The diode bar height 642 includes the distance across the semiconductor diode cavities including the semiconductor p-n junction(s). The diode bars diode bar height 642 may include the thickness of a semiconductor substrate 614, which may be placed in a desired orientation, for example 614(1) and 614(2) as shown. The diode bar height 642 may also be influenced by the thickness of associated electrical or ohmic contacts 612.

For the configuration show, the step height 625 represents the distance between diode emitter center lines 643 or diode bar "pitch" 620 in a direction parallel to emitters. In certain applications, the step height 625, and consequently the diode bar pitch 620, may be greater that the optical waveguide plates thickness 618. When the diode bar pitch 620 is greater than the optical waveguide plate thickness 618, adjacent optical waveguide plates are separated by a plate separation distance 616. The plate separation distance 616 may be desirable in certain situations.

Figure 7:
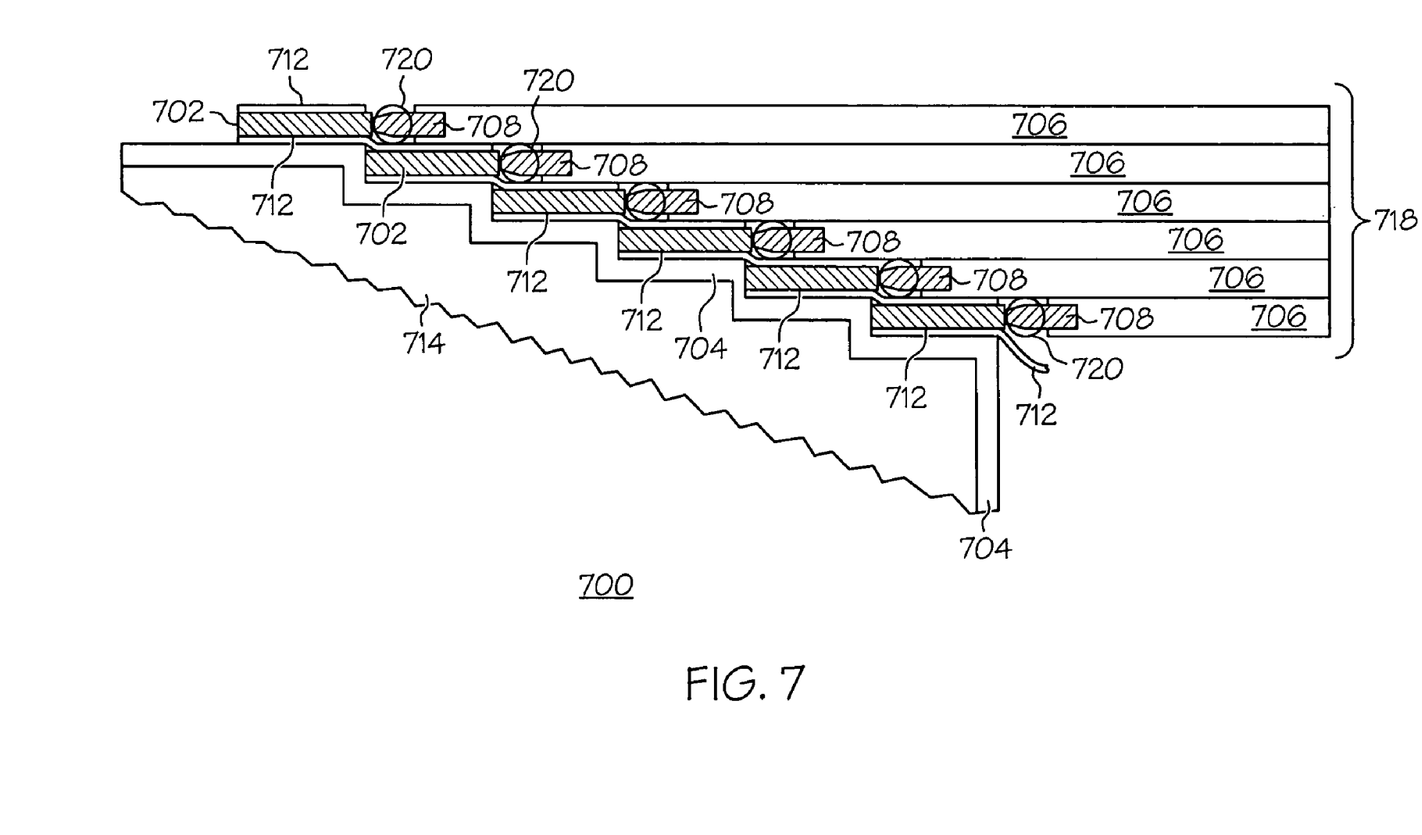
FIG. 7 is a side view of a staggered array coupler with collimating lenses.

In certain embodiments, the plate separation distance 616 may be used in conjunction with a lateral separation distance 626 between a diode bar 602 and associated step 603 to allow or facilitate the inclusion of collimating lenses, as described for FIG. 7. When a plate separation distance 616 exists between the optical waveguide plates, 606, waveguide spacers 636 having a desired shape may be present at desired locations to facilitate alignment or to provide structural support for the optical waveguide plates 606. In certain embodiments, suitable waveguide spacers 636 may include coatings and/or other waveguide structures, such as from separate diode assemblies. Suitable coatings can include suitable reflective optical coatings and/or films.

In certain embodiments, adjacent faces, 607 and 609, of adjacent optical waveguide plates 606 may be in contact with each other and no separation distance is present. Separation of adjacent optical waveguide plates 606 may be avoided in such instances by adjusting certain dimensions of the staggered array coupler 600, for example, by increasing the optical waveguide plate thickness 618 and/or by decreasing the step height 625. In certain embodiments, the step height 625 may be minimized to be equal or approximately equal to the diode structure height 642 plus the thickness of one of the electrical contacts 612. In such embodiments, electrical contacts 612 may be essentially flat, connecting the top of one diode bar 602 to the bottom of an adjacent diode bar 602.

The diode bar pitch 620 between diode bars 602 can thus be substantially independent of any related thermal management structure or cooling means, even for high-power diode bars. In addition, any support structure for the diode bars 602 can be mostly or entirely removed from the diode bar pitch as well since support structure can be included on the sides of the diode bars that are parallel to the emitter faces. The diode bar pitch 620 can accordingly be reduced to essentially the height of the diode p-n structures or cavities for a particular laser diode bar 602.

FIG. 7 is a side view of an embodiment 700 of a staggered array coupler with collimating lenses 720 that are present to collimate the divergence of the diode emitters in a desired direction, e.g., the fast axis. Two or more laser diode bars 702 are positioned on a support structure 714, with each diode bar 702 being positioned in a staggered relation to adjacent diode bars 702. The support structure 714 has a support surface 704, which may act as a cooling surface for the diode bars 702. Optical waveguide plates 706 are present to receive and direct outputs 708 of the diode bars to a desired location. A collimating lens 720 is positioned between each diode bar and the associated optical waveguide plate 706 to collimate fast axis of the related output 708 and improve the output beam aspect ratio. The optical waveguide plates 706 may be of differing lengths to accommodate the staggered diode bars 702 and direct the combined outputs to a common output plane 718. Any suitable optical material can be used for a collimating lens 720. In certain embodiments, the collimating lenses 720 may be cylindrical rods of optical quality glass, e.g., Type BK7. In certain embodiments, other optical elements such as polarizing filters may be used in conjunction with or in place of the collimating lens 720.

In the embodiment of FIG. 7, the support surface 704 is shown as integrated with the support structure 714. In such embodiments, the support structure 714 may include internal cooling means such as microchannels or continuous paths through porosities internal to the support structure 714.

In certain applications, it may be desirable to reduce or minimize the spatial extent of a staggered array coupler.

Figure 8:
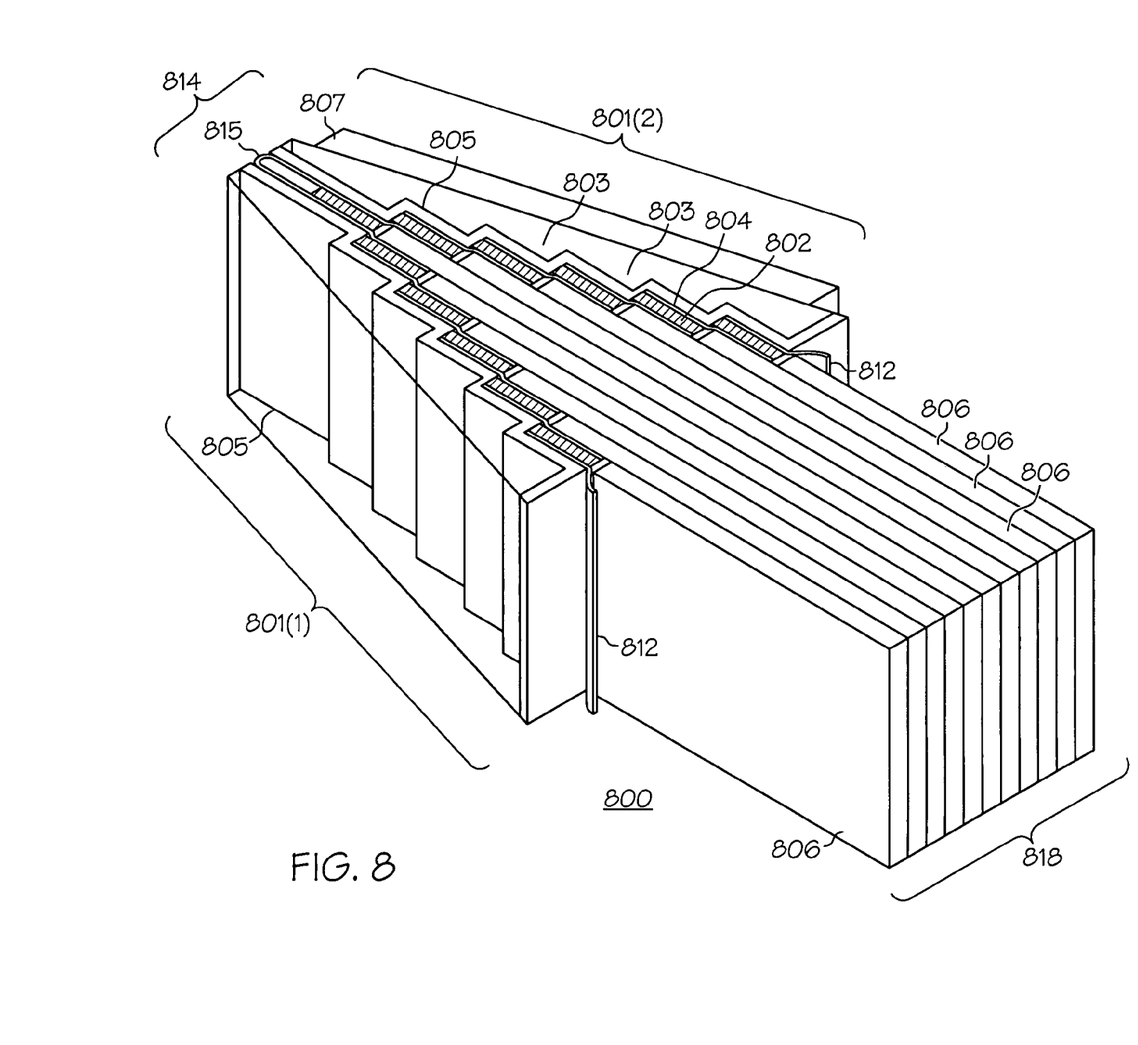
FIG. 8 is a perspective view of a "reverse-stair" embodiment of a staggered array coupler.

FIG. 8 is a perspective view of an alternative "reverse-stair" embodiment 800 of a staggered array coupler with a set of two connected support structures 801(1), 801(2), which each include two or more diode bars 802 and steps 803 with a support surface 804. The staggered ordering of the steps 803 may be reversed at a desired step vertex or vertex location 814, as shown. The resulting spatial extent of the staggered array coupler 800 in a direction parallel to the optical waveguide plates 806 may be approximately one-half as much as embodiments configured similar to those of FIGS. 5–7 for a given output area 818 and number of optical waveguide plates 806. Cooling means 807 are shown for one support structure 801(1).

Electrical or ohmic connections 812 connect the diode bars 802, e.g., in series as shown. In certain embodiments, an electrical connection 815 may connect opposing outward surfaces of the diode bar located adjacent to the vertex location 814. In other embodiments, power may be supplied to each support structure 801(1), 801(2) separately.

Figure 9:
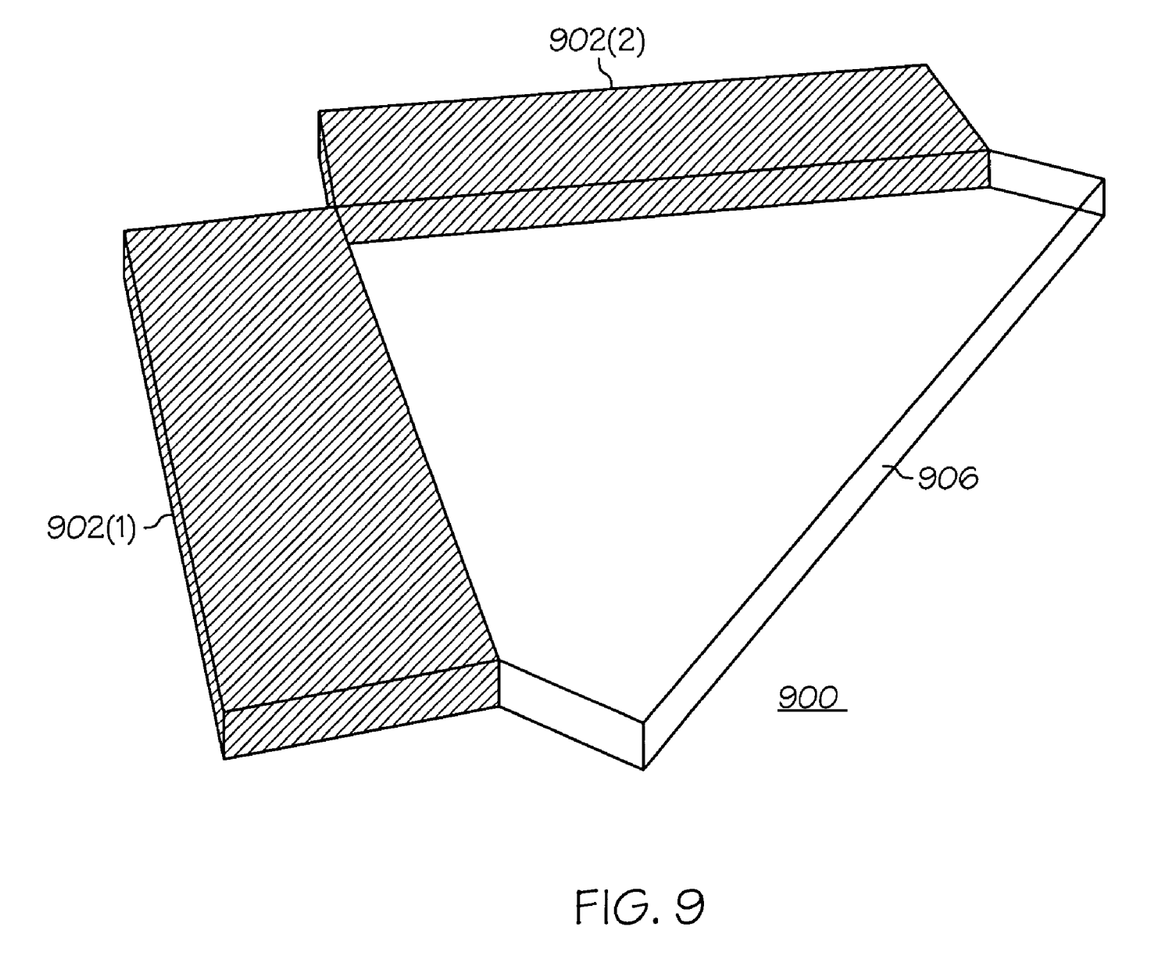
FIG. 9 is a perspective view of an alternate reverse-stair embodiment of a staggered array coupler.

FIG. 9 is a simplified, perspective view of an embodiment 900 of a reverse-stair stacked array coupler similar to the embodiment of FIG. 8. The stacked array coupler 900 includes two optical pump units 901(1), 901(2), which each include multiple staggered diode bars, power supply connections, and a support structure. The outputs (not shown) from the optical pump units 901(1), 901(2) may be directed into an assembly of optical waveguide plates 906. The optical pump units 901(1), 901(2) may include cooling means and/or a power supply, in certain embodiments. In the configuration shown, the reverse-stair stacked array coupler 900 may be well-suited for stacking or for applications requiring a small spatial extent in one dimension, such as for example a limited height due to application within an aircraft.

Figure 10:
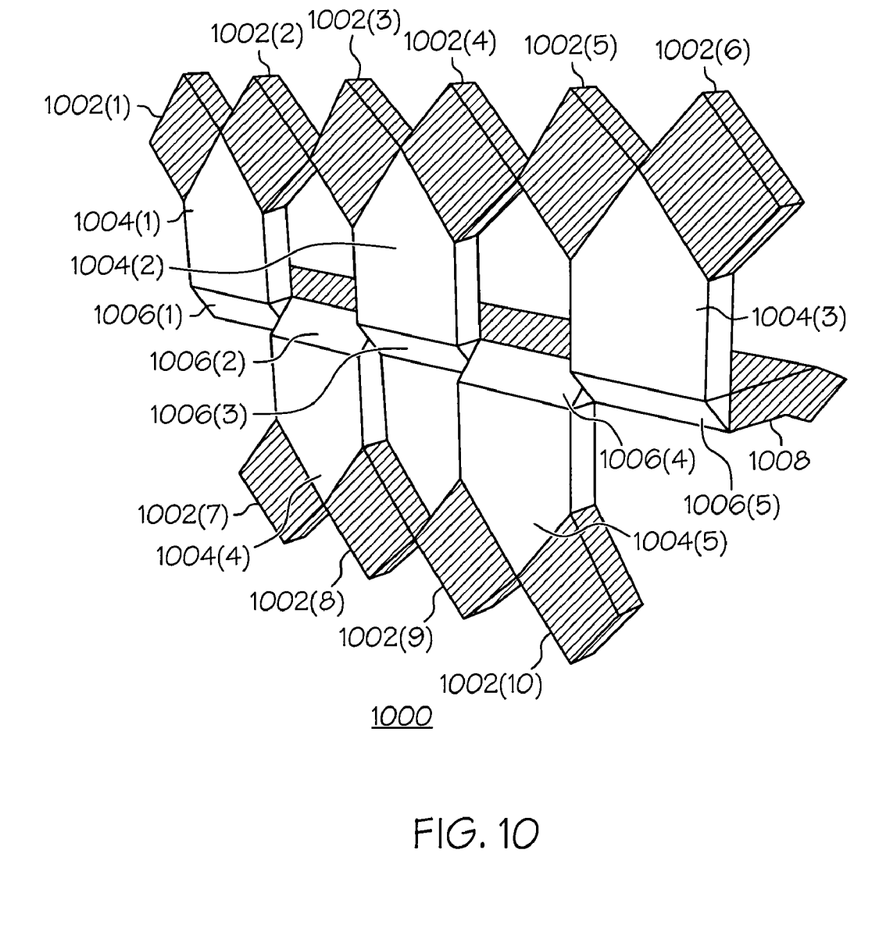
FIG. 10 is a perspective view of an assembly of reverse-stair staggered array couplers with a combined output.

FIG. 10 is a perspective view of an embodiment 1000 having multiple optical pump units 1002(1)–1002(10) arranged along a common plane. Pairs of the optical pump units 1002(1)–1002(10) may send diode bar outputs into an optical waveguide plate assembly 1004(1)–1004(5), with optical waveguide plates that each received an output from an individual diode bar. Prisms 1006(1)–1006(5) or other redirection means may be present to redirect the outputs from the optical waveguide plate assemblies 1004(1)–1004(5) into a common output 1008, as shown. Accordingly, the embodiment of FIG. 10 illustrates suitability for combining and scaling the outputs from optical pump assemblies to high powers and fluences.

Figure 11:
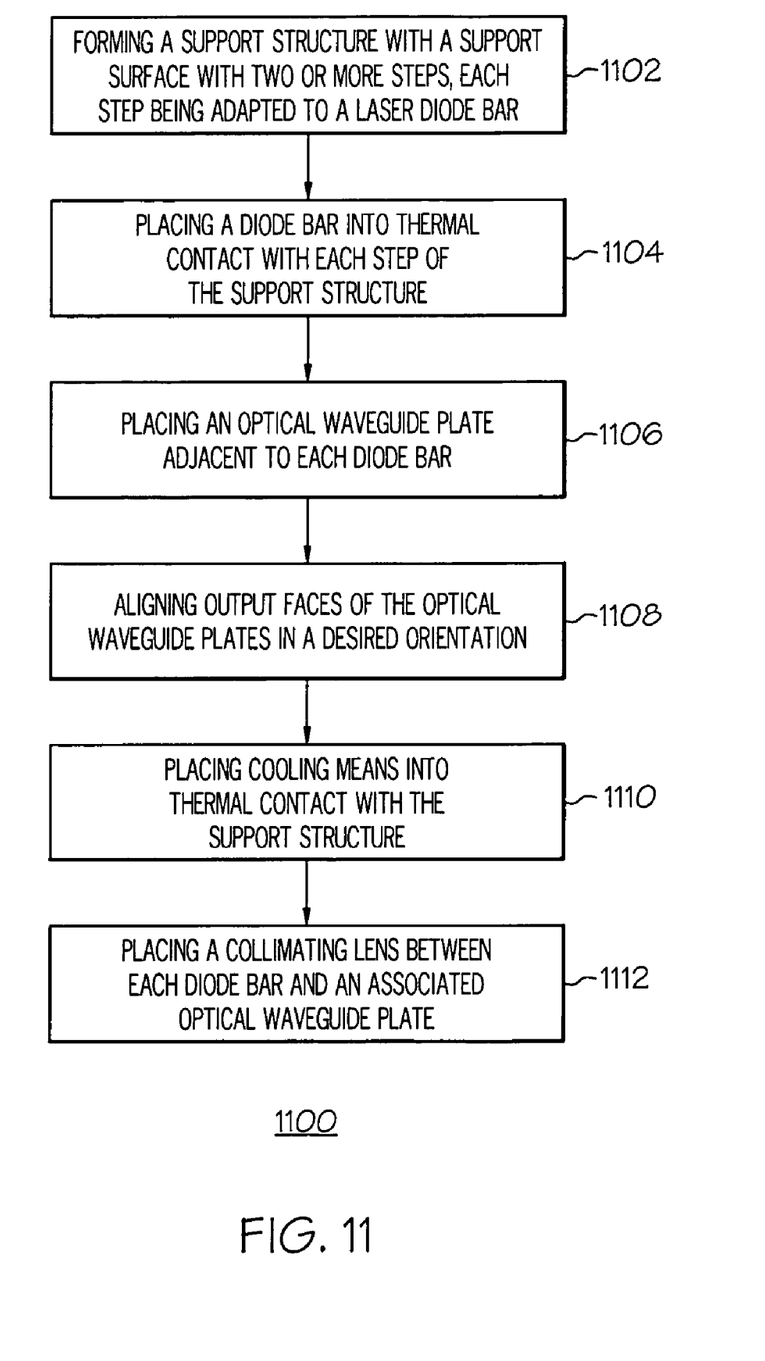
FIG. 11 shows steps in a method of manufacturing a staggered array coupler.

FIG. 11 shows steps in a method 1100 of manufacturing a staggered array coupler. A support structure may be formed 1102 with a cooling surface, a support surface, and two or more steps, with each step being adapted to a diode bar. The steps may be formed of a suitable high thermal conductivity material, including but not limited to copper or diamond. Techniques including known micromachining and/or lithography techniques may be used to form the support structure. A diode bar may be placed 1104 into thermal contact with each step. Each diode bar may have electrical or ohmic connections attached to opposite sides of an active region. An optical waveguide plate may be placed 1106 adjacent to an emitting area of each diode bar. Each optical waveguide plate may have a different length to accommodate the steps of the support surface. In certain embodiments, the optical waveguide plates may be fused or sintered together.

Continuing with the description of method 1100, the output ends or faces of the waveguide plates may be aligned 1108 in a desired orientation. For example, the output ends may be aligned in a plane or in a curve of a desired shape.

The optical waveguide plates may be constructed to have a desired cross section and shape. For example, the optical waveguide plates may have shapes, including but not limited to rectangular or trapezoidal prisms. In certain embodiments, the optical waveguide plates may be made to have a varying thickness. Cooling means may be placed 1110 into thermal contact with the support structure. In certain embodiments, cooling means may be integrated into the support structure. A collimating lens may optionally be placed 1112 between each diode bar and an associated optical waveguide plate.

Figure 12:
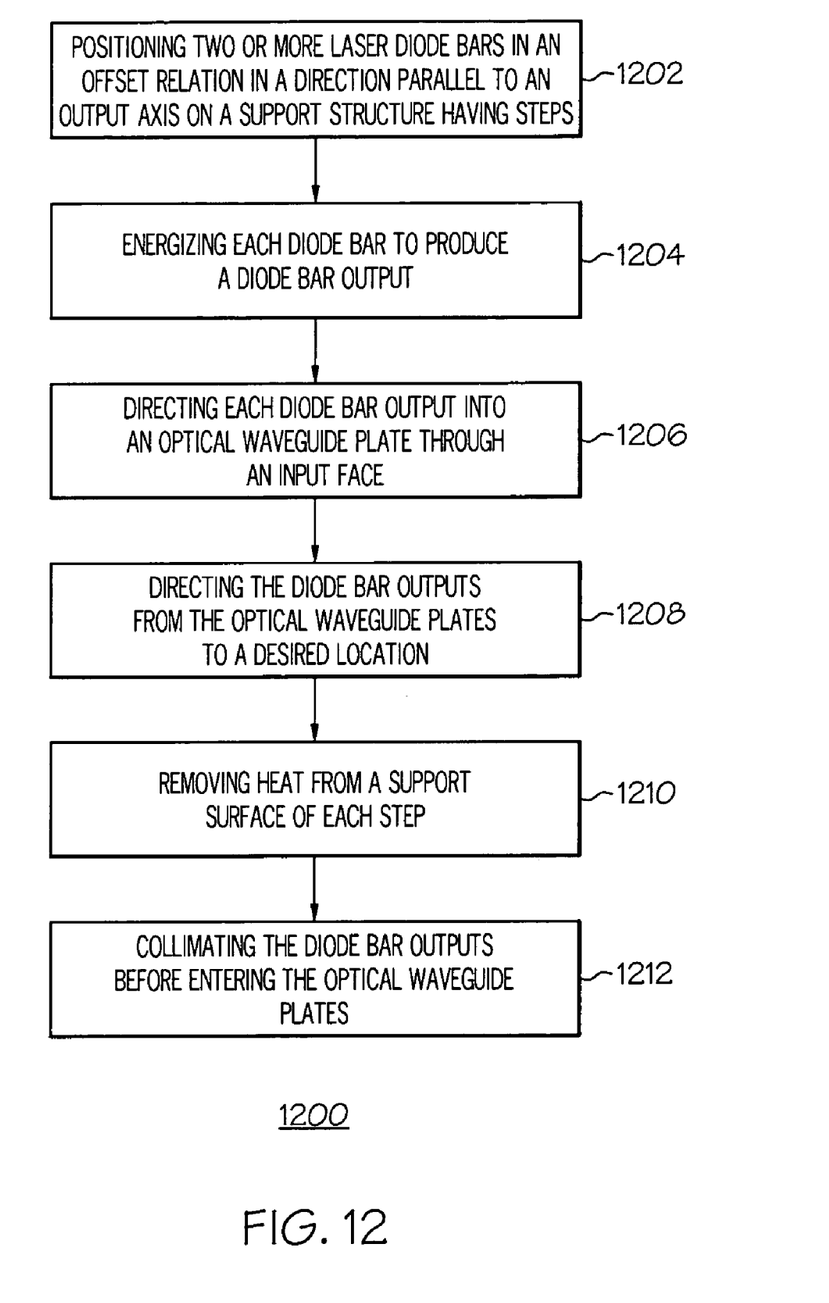
FIG. 12 shows steps in a method of producing high-power pump energy.

FIG. 12 shows steps in a method 1200 of producing high-power pump energy from diode bars, for example, for pumping a laser gain medium. Two or more laser diode bars may positioned 1202 in an offset relation to each other in a direction parallel to an output axis on a support structure. The support structure may have steps that include a support surface. Each diode bar may be energized by appropriate means, e.g., current supplied through electrical connections, to produce 1204 a diode bar output.

Each diode bar output may be directed 1206 into an optical waveguide plate through an input face. The diode bar outputs may be directed 1208 from output faces of the optical waveguide plates to a desired location, for example, a desired laser gain medium. Heat may be removed from the support surface of each step 1210. The diode bar outputs may optionally be collimated 1212 before entering the optical waveguide plates.

Accordingly, embodiments of the present invention may be useful in applications where there is a need for high-intensity, high-brightness light. Embodiments may increase the flux and brightness that are attainable from diode bar assemblies. Such applications may include, but are not limited to, illumination for lighting, observation, photography processing, photo-chemical reactors, photo-curing, photo-aging, photo-exposure, photo-pumping of gaseous, liquid and solid media so that they may in turn radiate as sources based on fluorescence, laser action, Raman scattering, or by any other photo emission or photo luminance process.

In particular, systems and methods according to the present invention may be applicable to beam combining of the outputs of multiple diode arrays or diode bars for high-power pumping of various laser gain media. For example staggered array couplers may be used for pumping gain media grown from crystals or from pressed and sintered ceramic laser gain media materials, such as neodymium-doped yttrium aluminum garnet (Nd:YAG), with neodymium-doped gadolinium gallium garnet (Nd:GGG), or ytterbium-doped yttrium aluminum garnet (YB:YAG) crystals or ceramics.

The diode bars described may be operated in continuous wave (CW) or pulsed manner and the pumped lasers may be operated in continuous wave (CW) output or pulsed manner. Embodiments of the present invention may be particularly well suited for use when scaling to high average power is desired. Examples of such high-power applications include, but are not limited to, use in high-power lasers that find applications in research, metal fabrication, material fabrication, including drilling, cutting, and surface treating, diagnostics, communication, power transmission, defense systems, and medical applications.

Although the present invention has been described in considerable detail with reference to certain preferred version thereof, other versions are possible. For example, while the previous description made reference to use of embodiments of staggered array couplers for pumping certain gain media, embodiments of the present invention may be used for the pumping or optical excitation of any suitable gain media. Additionally, while the previous description has described the used of similar diode bars with similar power outputs, pitch, output wavelengths, such characteristics may be varied between diode bars within the scope of the present invention.

Furthermore, while optical waveguide plates have been described herein as being substantially planar with a uniform thickness, the dimensions of the optical waveguide may vary as desired. In certain embodiments, for example, the thickness of an individual optic waveguide plate may vary along the length or long axis of the optical waveguide plate. Additionally, laser diode bars that include one or more quantum wells may be used within the scope of the present invention. Diode bars producing outputs at any desired wavelength may be used. For example, while certain infrared wavelengths, e.g., near infrared (NIR), have been described, laser diodes producing diode outputs in ultraviolet (UV), visible, and other infrared ranges, e.g., medium infrared (MIR), may also be used. In certain embodiments, diode bars may include active regions with Indium-Gallium-Arsenide-Phosphide (InGaAsP), Indium-Gallium-Aluminum-Arsenic (InGaAlAs), Indium-Gallium-Arsenide (InGaAs), and/or Gallium-Arsenide (GaAs), grown on suitable semiconductor substrates.

It should be understood that while a series electrical connection has been described and shown for electrical contacts between diode bars, i.e., proximate sides of adjacent diode bars were described as connected in series, other suitable electrical connections may be used within the scope of the present invention. For example, respective sides of diode bars in a staggered array coupler, e.g., the p-sides, may be connected in series by an electrical connection along one side of the staggered array coupler and the opposing sides, e.g., the n-sides, may be connected in series along the opposite side of the staggered array coupler, with current flowing through the diode bars in parallel.

The reader's attention is directed to all papers and documents that are filed concurrently with this specification and which are open to public inspection with this specification, and the contents of all such papers and documents are incorporated herein by reference. All the features disclosed in this specification, including any accompanying claims, abstract, and drawings, may be replaced by alternative features serving the same, equivalent or similar purpose, unless expressly stated otherwise.

What is claimed is:

1. A staggered array coupler comprising:
   a stepped support structure having two or more steps and a cooling surface;
   two or more diode bars, each of said two or more diode bars having an emitter face, wherein each of said two or more diode bars is disposed on a separate step of said two or more steps; and
   two or more optical waveguide plates, each of said optical waveguide plates being disposed with an input face adjacent to an emitter face of one of said two or more diode bars;
   wherein said two or more optical waveguide plates are in contact with each other.

2. The staggered array coupler of claim 1, further comprising cooling means in thermal communication with said cooling surface.

3. The staggered array coupler of claim 1, further comprising two or more collimating lenses, wherein each of said two or more lenses is disposed between an emitter face of one of said two or more diode bars and an input face of said two or more optical waveguide plates.

4. The staggered array coupler of claim 1, wherein each of said two or more diode bars is operable to emit light within a desired wavelength range.

5. The staggered array coupler of claim 4, wherein said desired wavelength range includes a near infrared range.

6. The staggered array coupler of claim 5, wherein said near infrared range includes 808 or 980 nm.

7. The staggered array coupler of claim 1, further comprising pump means connected to said two or more diode bars.

8. The staggered array coupler of claim 7, wherein said pump means comprises electrical connections between said two or more diode bars, said electrical connections operable to receive electrical current from a power source.

9. The stacked array coupler of claim 8, wherein said electrical connections connects a first face of one diode bar to a second face of a second diode bar.

10. The staggered array coupler of claim 1, wherein said two or more optical waveguide plates have output faces that are coplanar to each other.

11. The staggered array coupler of claim 1, wherein said two or more optical waveguides plates have a separation distance between respective pairs of said two or more optical waveguide plates.

12. The staggered array coupler of claim 11, further comprising two or more spacer plates, each of said two or more spacer plates being disposed between pairs of said two or more optical waveguide plates.

13. The staggered array coupler of claim 12, wherein each of said spacer plates has an input face receiving light from one of two or more second light sources.

14. The staggered array coupler of claim 13, wherein said two or more second light sources include two or more second diode bars and further comprising a second stepped support member having a plurality of steps, wherein each of said two or more second diode bars are disposed on respective steps of said second stepped support member.

15. The staggered array coupler of claim 1, wherein said each of said two or more diode bars includes an active region comprising semiconductors selected from the group consisting of Indium-Gallium-Arsenide-Phosphide (InGaAsP), Indium-Gallium-Aluminum-Arsenic (InGaAlAs), Indium-Gallium-Arsenide (InGaAs), and Gallium-Arsenide (GaAs).

16. The staggered array coupler of claim 1, further comprising a step vertex between a pair of said two or more diode bars, wherein said staggered array coupler is a reverse-stair staggered array coupler.

17. The staggered array coupler of claim 1, wherein a first portion of the cooling surface is disposed along a step length of the stepped support structure and wherein a second portion of the cooling surface is disposed along a step height of the stepped support structure, the step height being substantially perpendicular to the step length and the step height being substantially equal to a height of the diode bar.

18. The staggered array coupler of claim 1, wherein the two or more steps of the stepped support structure are integrally formed with the stepped support structure.

19. The staggered array coupler of claim 1, wherein the stepped support structure defines a substantially uniform thickness between a juncture of a step length of the stepped support structure and a step height of the stepped support structure and an opposing portion of the stepped support structure.

20. A stepped diode assembly adapted for use in a staggered array coupler comprising:

a stepped support member having a plurality of steps, a step contact surface, and a cooling surface; and a plurality of diode bars, each of said plurality of diode bars being disposed on a respective one of said plurality of steps;

wherein an emitter face of each of the plurality of diode bars is configured to be disposed adjacent to an input face an optical waveguide plate wherein two or more optical waveguide plates are in contact with each other.

21. The stepped diode assembly of claim 20, further comprising cooling means in thermal communication with said cooling surface.

22. The stepped diode assembly of claim 21, wherein said cooling means comprise a liquid spray system.

23. The stepped diode assembly of claim 21, wherein said cooling means comprise a microchannel structure.

24. The stepped diode assembly of claim 21, wherein said cooling means comprise a cooling slab.

25. An optical waveguide structure adapted for use in a staggered array coupler comprising:

a plurality of optical waveguide plates, each of said plurality of optical waveguide plates having an input face and an output face, each of said input faces being offset with respect to each adjacent input face, each of said plurality of optical waveguide plates having a height corresponding to a diode pitch of a stepped support surface;

wherein two or more optical waveguide plates are in contact with each other.

26. The optical waveguide structure of claim 25, wherein each of said optical waveguide plates is shaped as a rectangular prism.

27. The optical waveguide structure of claim 25, wherein each of said optical waveguide plates has a constant cross section.

28. The optical waveguide structure of claim 25, wherein each of said optical waveguide plates has a varying cross section.

29. The optical waveguide structure of claim 25, wherein each of said optical waveguide plates is made from Type BK7 optical glass.

30. The optical waveguide structure of claim 25, wherein each of said plurality of optical waveguide plates comprises a collimating lens that is optically coupled to said input face and operable to receive a diode bar output.

31. The optical waveguide structure of claim 25, wherein each of said plurality of optical waveguide plates comprises a polarizing filter that is optically coupled to said input face and operable to receive a diode bar output.

32. A method of manufacturing a staggered array coupler comprising the steps of:

forming a support structure having a support surface with two or more steps, each of said two or more steps being adapted to a diode bar height;

placing a diode bar into thermal contact with each said two or more steps;

placing an optical waveguide plate adjacent to an emitting area of each of said diode bars;

aligning output faces of said optical waveguide plates in a desired orientation; and fusing said optical waveguide plates.

33. The method of claim 32, wherein said step of aligning output faces of said optical waveguide plates in a desired orientation comprises aligning said output faces along a common plane.

34. The method of claim 32, wherein said step of aligning output faces of said optical waveguide plates in a desired orientation comprises aligning said output faces along a desired curve.

35. The method of claim 32, further comprising integrating cooling means into said support structure.

36. The method of claim 32, further comprising placing a collimating lens between each of said diode bars and an associated optical waveguide plate.

37. The method of claim 32, further comprising placing waveguide spacers between said optical waveguide plates.

38. A method of producing high-power pump energy comprising the steps of:

positioning two or more diode bars offset to each other on a support structure having two or more steps;

energizing each of said two or more diode bars to produce a diode bar output and forming two or more diode bar outputs;

directing each of said two or more diode bar outputs into an optical waveguide plate through an input face wherein two or more optical waveguide plates are in contact with each other; and directing each of said two or more diode bar outputs from an associated optical waveguide plate to a desired location.

39. The method of claim 38, further comprising removing heat from a support surface of each of said two or more steps.

40. The method of claim 38, further comprising directing each of said two or more diode bar outputs to said desired location through a common output plane including output faces from each of said optical waveguide plates.

41. The method of claim 38, wherein said desired location includes a laser gain medium.

42. A laser pump system comprising:

two or more optical pump units having two or more staggered diode bars, two or more power supply connections connected to said two or more staggered diode bars, a support structure supporting said two or more diode bars, and two or more optical wave guide plates each receiving an output from one of said two or more staggered diode bars and directing said output to a common output plane wherein each said optical pump unit is operable to produce a pump unit output; and further comprising redirection means receiving said pump unit outputs from said two or more optical pump units and operable to combine said pump unit outputs.

43. The laser pump system of claim 42, wherein said redirection means comprise one or more prisms.

44. The laser pump system of claim 42, wherein said redirection means comprise one or more mirrors.

45. The laser pump system of claim 42, wherein said two or more optical pump units comprise two, four, six, or eight optical pump units.

46. The laser pump system of claim 42, further comprising a power supply connected to said two or more supply connections.

* * * * *